ANALOG TO DIGITAL CONVERTER SYSTEM

Filed Oct. 15, 1963 2 Sheets-Sheet 1

WITNESSES:
Leon M. Garman
John G. Chopp

INVENTORS
John M. Bentley, Walter J. Lytle
and Charles P. Holt Jr.
BY John L. Negreffe
ATTORNEY April 25, 1967 J. M. BENTLEY ETAL 3,316,546

ANALOG TO DIGITAL CONVERTER SYSTEM

Filed Oct. 15, 1963 2 Sheets-Sheet 2

United States Patent Office 3,316,546
Patented Apr. 25, 1967

3,316,546
ANALOG TO DIGITAL CONVERTER SYSTEM
John M. Bentley, Glen Burnie, Walter J. Lytle, Catonsville, and Charles P. Holt, Jr., Baltimore, Md., assignors to Westinghouse Electric Corporation, Pittsburgh, Pa., a corporation of Pennsylvania
Filed Oct. 15, 1963, Ser. No. 317,867
16 Claims. (Cl. 340—347)

This invention relates to a novel and improved analog to digital converter system.

Perhaps the most common analog-to-digital converter systems are those utilizing a comparator circuit in combination with a forward-backward counter.

In a copending application, Ser. No. 267,165 filed Mar. 22, 1963, in the name of John M. Bentley for an Analog to Digital Conversion System, and assigned to the assignee of this application, such a system is described and claimed which might be considered to be typical of such systems. However, that application is particularly directed to the novel comparator circuit used therein.

It is an object of the present invention to provide a novel, improved and simplified analog-to-digital system which utilizes a binary counter that sequentially counts forward from a selected reference voltage to a voltage representing, to within the least significant digit, within the resolution accuracy of the system, the instantaneous analog input and then recycles.

Another object is to provide a novel and improved analog-to-digital converter which will be simple, have a high degree of accuracy, and be capable of very high speed operation.

The invention itself, however, both as to its organization and method of operation as well as additional objects and advantages will be best understood from the following description when read in connection with the accompanying drawing, in which.

Broadly speaking, the present invention eliminates the necessity for the usual voltage comparator, an improved embodiment of which, is shown and described in the aforementioned copending patent application. This will be immediately apparent from reference to the circuit diagram of FIG. 3.

A binary counter using conventional complementing flip-flop circuits is used in the present system to develop an analog voltage ramp function through a suitable conventional electrical summation network, such as that illustrated in the aforementioned copending application. The ramp function voltage generated from the parent sides of the respective counter stages is used directly to sample the unknown input analog through a unilaterally conducting voltage responsive switching device, such as a tunnel diode, to provide an improved, simplified system having improved gain characteristics.

Since the present invention resides in a novel arrangement of conventional components, it is appropriate to proceed at this point with a discussion of the novel functional aspects of the invention before describing a physical embodiment of this invention.

In the present invention, the analogue signal transducer will be chosen to be of polarity opposite to that of the generated parent ramp function used for sampling. In the illustrated embodiment, this ramp function is chosen to be positive-going. The analogue input is sampled through an asymmetrical voltage-responsive device, such as a tunnel diode which, in response to a selected algebraic sum, as distinguished from the numerical difference of prior devices, compares the output of a binary counter which is caused to repeatedly count forward at a selected rate from zero time reference points until the generated ramp function is equal, to or greater than the instantaneous value of the difference between the analogue signal input and a selected "ceiling" or "firing" amplitude voltage of the tunnel diode.

Figure 1:
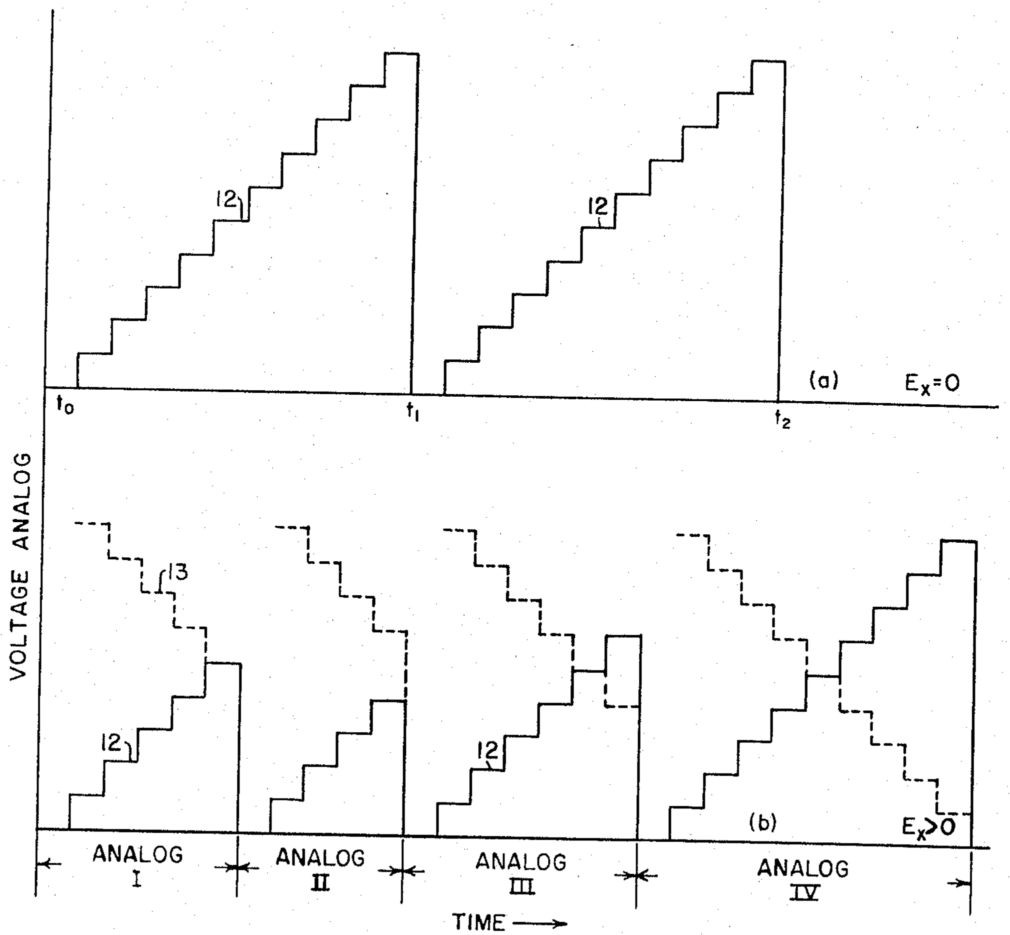
FIGURE 1 is a graph helpful in the understanding of the present invention, illustrating the digitized ramp function generated by the parent side binary digital counter.
Figure 3:
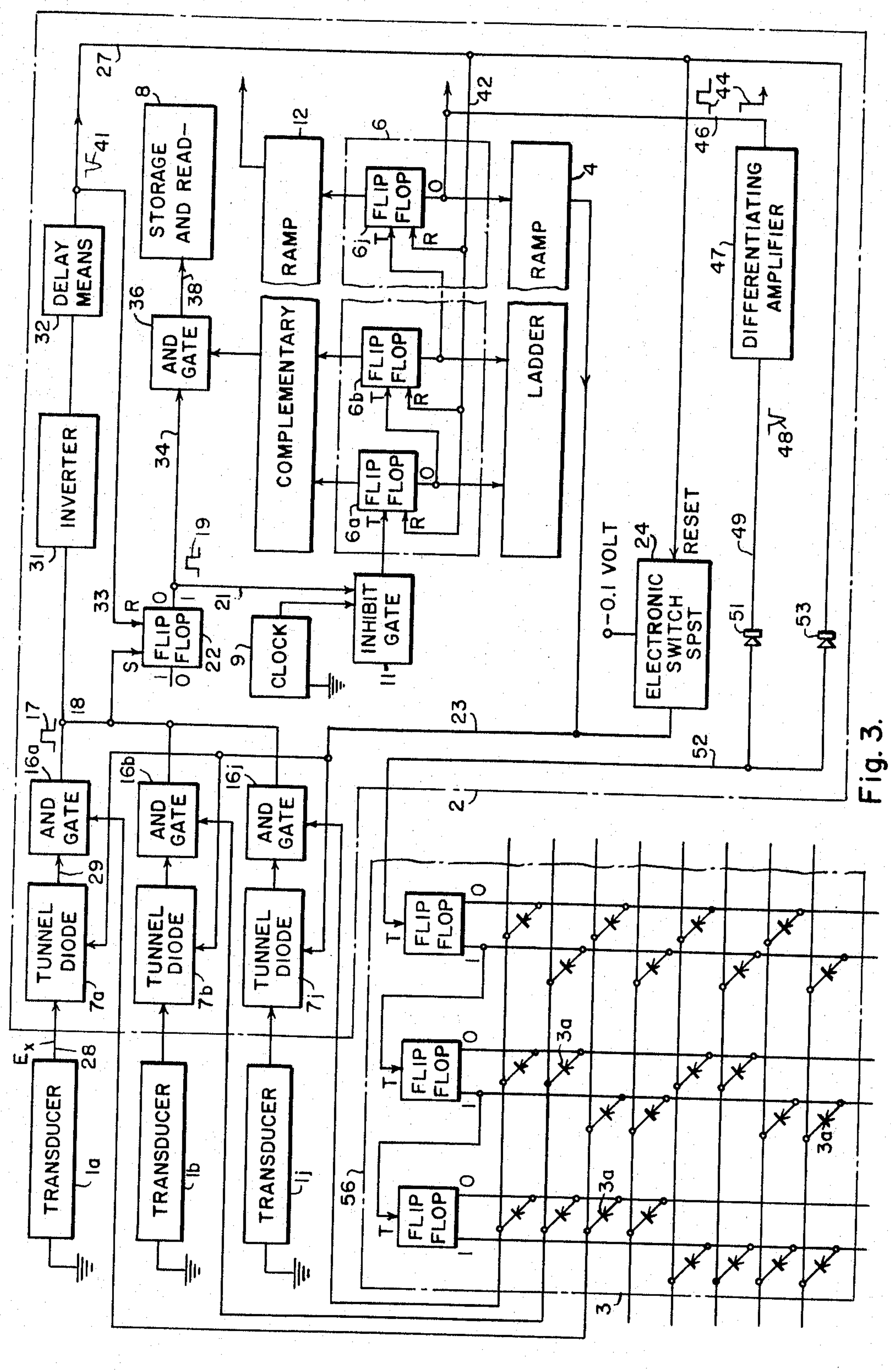
FIG. 3 is a block circuit diagram of the system of the present invention.

This binary digital ramp function reference voltage is preferably generated from the parent output digits of the respective stages of the binary counter. Knowing the total number of the bits in the counter and the frequency of the clock pulses, the read-out information can be evaluated in terms of a voltage or a time analogue. Under circumstances more fully explained hereinafter and as illustrated in FIGS. 1 and 3, the counter stops counting during each counting cycle when the absolute sum of the generated binary digital reference voltage ramp function and the analog input amplitude equals or exceeds the firing potential of the tunnel diode. The voltage increase due to the switching of the tunnel diode is used to control the operation of the counter.

Simultaneously, while the positive-going ramp function is being generated in one summation network from the parent sides of the counter stages, a complementary ramp function may also be generated from a complement summation network operatively associated with the outputs of the complement sides of the stages. The read-out information in digital or analogue form may be taken from the complement sections of the counter stages.

"Parent," as used herein, refers to that side of the counter stages and their digits, or states, that represent directly the absolute value of the binary count in the counter. "Complement" as used herein refers to the other sides, digits or states of the respective stages of the counter.

Figure 2:
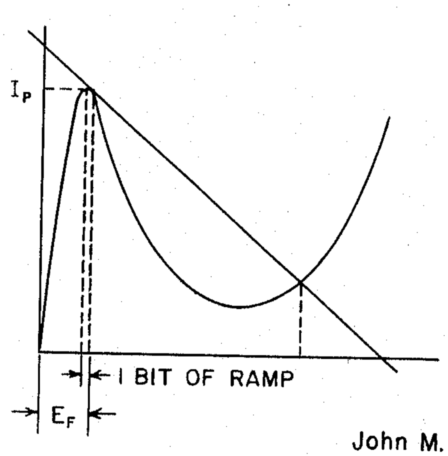
FIG. 2 is a graph illustrating the adaption of a tunnel diode to the novel analog to digital converter in accordance with the present invention.

A salient feature of the present invention is illustrated by the utilization of a voltage-responsive asymmetrical device, such as a tunnel diode, as a high gain summing device for the purpose of sampling the generated stepped parent ramp function from the counter, and effectively, comparing its amplitude with the unknown analog input voltage. The characteristics of a tunnel diode, as illustrated in FIG. 2, are generally well known. As will be seen from the subsequent description, the tunnel diode, which is in the portion of the input circuit of the system in which the analog ramp function and the input analog signal is compared, is biased by the generated stepped analog ramp function plus the analog input to a point just below the peak potential $E_P$ of FIG. 3 so that one additional "bit" of the ramp function amplitude will cause the tunnel diode to fire, thus causing the value of the input analog voltage to be read-out on the digital indicator.

In the illustrated embodiment of the invention, the unknown analog input is negative going and the positive going ramp function generated from the output of the parent sides of the computer stages is used as a feedback for sampling the input. However, alternatively, the complement ramp function could be utilized as the feedback for sampling the input if the unknown analog input was positive-going.

Referring now to FIG. 3, a system in accordance with the present invention comprises a plurality of analog transducers, three of which are shown and designated at 1*a*, 1*b* and 1*j*. These transducers may provide analog outputs of any desired time functions, such as temperature, speed, acceleration and so forth. Although only three transducer inputs are shown, it will be readily apparent that this number may be extended to any practical limit consistent with the complexity of the system and the required limit of access time to the output. The digitizing of these time functions is time shared by the digitizer portion 2 of the system, which includes most of the components to the right of the transducers but does not include the matrix 3 for effecting the time sharing between the individual transducers.

For the purpose of simplification of explanation, a detailed explanation of one channel involving the transducer 1*a* will be described first and then will be followed by the necessary explanation of the operation of the matrix 3 to complete the description. The output of the transducer 1*a* is sampled and compared at a high rate with a ramp function reference voltage illustrated at 12 in FIG. 1, generated in a ramp function generator 4 which is energized by the parent side output of counter 6. Each of the transducers feeds into an asymmetrically-conducting voltage responsive device, such as a tunnel diode. The transducer 1*a* has its output connected to a tunnel diode 7*a* which responds to the algebraic difference between the generated ramp function reference voltage 12 from the generator 4 and a selected "ceiling" or "firing" voltage $E_F$ which initiates the operation of the counter 6, as will be explained in further detail later. In the embodiment illustrated, as previously mentioned the output of the transducers is chosen to be negative while the ramp function reference voltage is positive-going. The normal bias on the tunnel diode is chosen such that neither the output voltage from the tunnel diode nor the maximum voltage from the ramp function generator can cause the tunnel diode to fire. The bias on the tunnel diodes will be set to fire slightly above the maximum of the input analog voltage from the transducers so that only a combination of the generated analog output from the transducer and the reference voltage will fire the tunnel diode. The output of the tunnel diode 7*a* controls the operation of the counter 6 and the ramp function reference voltage is generated in the ramp function generator 4 in response to the output from the counter 6, thus completing the sampling loop. The operation of the counter 6 is also synchronized with the operation of a suitable storage device 8 where the digital representation of the analog input is indicated.

As the description proceeds, it will be apparent that the counter 6 must stop counting during the read-out interval. One of the salient features of the present invention is the provision of the simple and novel means for stopping the counter as soon as the amplitude of the ramp function reference voltages plus the analog approximates the firing potential of the tunnel diode within the error signal range. All the stages of the counter are then reset to start counting again to sample a corresponding point on the next analog input voltage time function and to fire the next transducer. If there was a single unit having only the single signal transducer 1*a*, the initiation of the operation of the counter 6 would be accomplished by any suitable delay unit (not shown) such as a ring counter triggered by the clock pulses in a well known manner. However, whether one, or a plurality of transducers, as in the embodiment illustrated, it is necessary to utilize the matrix 3 for sequentially selecting or enabling the AND gates associated with the transducer on which conversions required. In the generation of the ramp function reference voltage 12 as indicated in FIG. 1, the counter 6 is controlled by conventional clock pulses supplied from the the clock pulse generator 9. The pulses from the generator 9 are supplied to the first stage of the counter through a conventional inhibitor gate 11. The stages of the counter 6, only three of which are shown and designated as 6*a*, 6*b* and 6*j*, respectively, are conventional flip-flop circuits connected in cascade in the manner of a binary counter, the first stage 6*a* being triggered into alternate zero and one states by respective successive output pulses from the generator 9. The parent output of the respective stages is supplied as the trigger pulse to the successive stage and also to the parent ramp voltage function generator 4 to provide the ramp function reference voltage. The complement side of each stage is connected to the ladder circuit of the complementary ramp function generator 12 to generate the complementary ramp function 13 illustrated in dotted line, which is coincident in time with the positive-going current ramp function reference voltage 14 from the ramp function generator 4.

The stages 6*a* and 6*b* and 6*j* are of conventional design, known as complementing flip-flops, because after each input pulse either output signals represent the 1's complement of its previous value. The internal circuitry of such conventional flip-flops is described at page 73 in "Digital Computer Components and Circuits" by R. K. Richards, published by D. Van Nostrand Company, Incorporated, 1957. In such flip-flops or counter stages, the input is connected to both sides and causes the flip-flops to alternate between their two stable states in response to a series of input pulses at the common input circuit. Then the output from one side may be considered as the parent output and the output from the other side may be considered as the complement output. The digital-to-analog converter electrical summation networks 4 and 12 are the type known in the art as the constant impedance type and further explanation and description of these is believed unnecessary. The switching devices for controlling the energization of the resistor elements of the summation networks may be similar or equivalent to those shown and described in the aforementioned copending application.

As explained previously, the counter 6 counts up from zero amplitude of the ramp function reference voltage from time reference points determined by the difference between the reference voltage and the analog input voltage. The greater the difference between the reference voltage and the analog input voltage, constituting the error signal, the more digits the counter 6 will count and therefore the longer will be the time interval between zero reference points which is a measure of the complement of the time analog of the instantaneous output of the transducer 1*a*. The length of the count, that is, the number of the counts as well as the length of the time interval during the counts is inversely proportional to the instantaneous amplitude of the output from the transducer 1*a*. It will be seen that the operation of the counter 6 is controlled entirely by the clock pulses delivered to it from the generator 9 through the inhibitor gate 11 which in turn is controlled by the output of the tunnel diode 7*a*. It will be noted that there are AND gates 16*a*, 16*b* and 16*j*, respectively, in the output circuits of the diodes 7*a*, 7*b* and 7*j*. It should be noted here that the AND gates do not enter into the fundamental operation of the digitizing portion of the system. These AND gates are necessary merely for the purpose of time sharing the multiple channels with the digitizing portion 2 of the system. Therefore, for purposes of simplification in describing the fundamentals of the digitizer portion of the circuit it can be considered that the AND gate 16*a* is opened so that the output of the tunnel diode 7*a* represented by the pulse 17 is supplied to the circuit junction point 18.

Since the clock generator 9 is continuously putting out timing pulses, the operation of the inhibitor gate 11 provides the ultimate control for the counter 6. The inhibitor gate 11 in turn is controlled by control pulses 19 on connection 21 which is energized only when flip-flop gate 22 is in the reset position.

Since a tunnel diode can be parameterized as a bistable device, it will be obvious that some means is required to bring it back to zero state after it has been "fired" in response to an error signal representing the difference between the output of the transducer and the ramp function reference voltage on connection 23. In the illustrated embodiment, this means is the single pole electronic switch 24 which is adapted to apply a reset biasing voltage supplied to connection 26 from any source of negative potential, not shown. The switch 24 is adapted to be closed in response to a reset pulse appearing on connection 27, which is generated in a manner hereinafter described. Considering one channel operation of the embodiment of the invention shown in FIG. 3, first it will be assumed that the output voltage $E_X$ on connection 28 is zero and, of course, it will be assumed that all of the other components of the digitizing system are in the zero, or set, state so that there will be no signal output on connection 29 and therefore there will be no signal occurring at the point 18. Under this condition, the flip-flop switch 22 will be in the zero set position and will be supplying a signal 19 on the connection 21 to the inhibitor gate 11. This signal will hold the inhibitor gate open so that the clock pulses from the clock generator 9 will be passed to the first flip-flop stage 6*a* of the counter 6 causing the counter to count in binary fashion and cause the ladder ramp 4 to generate a periodic stepped ramp function reference voltage 12 like that shown in FIG. 1(*a*).

Now assuming that the voltage $E_X$ on connection 28 has some finite value which, as explained previously, when added to the ramp function reference voltage generated in the ladder 4 causes the tunnel diode 7*a* to fire thereby placing an output signal on connection 29, it being assumed that gate 16*a* is open due to matrix position. A positive signal 17 will then appear at the junction 18. Since the inhibitor gate 11 is open the clock pulses from the clock generator 9 will continue to pass through the inhibitor gate 11 into the counter 6 and will continue to generate a stepped ramp function voltage to a value which when added to the voltage $E_X$ causes the tunnel diode 7*a* to fire. When this pulse is supplied to the set side of flip-flop 22, the right hand side changes from state zero to state one and the left hand side changes from state I to state zero producing a pulse signal 19 on connection 21 causing inhibitor gate 11 to close, stopping the operation of the counter 6. The pulse 17 on junction 18 travels over the delay and reset circuit which includes an inverter 31, a time delay means 32 and through connection 33 the delay pulse 41 is supplied to the reset side of the flip-flop 22. This is a very short pulse which temporarily closes inhibitor gate 11 and provides the reset interval previously mentioned. The pulse 19 out of the reset side of the flip-flop 22 is supplied over connection 34 to AND gate 36 to which is also supplied the output of the complementary ramp function generator 12 over connection 37. The concidence of signals on connections 34 and 37 opens the gate 36 so that the read-out signal is supplied over connection 38 to the storage and read-out device 8. The read-out device 8 may be responsive to an analog voltage, calibrated in terms of the analog represented by the count of the parent sides of the stages. Alternatively, the device 8 may be a device calibrated in terms of the time analog of count of the parent sides.

Since the tunnel diode 7*a* is a monostable device, the delay and reset pulse 41 appearing on connection 27 is also supplied to an electronic switch 24 which supplies the appropriate negative voltage to switch the tunnel diode to its original state. In accordance with conventional practice, the reset pulse 41 is also supplied over connection 42 to the different stages of the counter 6 to put them back to zero position to thus establish, aperiodically, a zero time reference point.

Two conditions of operation have been described above; one is the condition assuming that there is no output signal from the transducer 1*a*, that is $E_x=0$, and the other is the condition assuming that there is an output from the transducer within the limits of operation of the system, that is $E_x>0$. First again assuming that there is no output from the transducer 1*a*, from the foregoing description it will be apparent that the inhibitor gate 11 is open so that clock pulses from the clock generator 9 will be continuously fed to the counter 6. Under this condition, the counter continues to operate as a binary counter so that as soon as the last stage is triggered the count starts over again in the first stage. The parent output from the ramp generator 4 then generates a series of periodic ramp functions, two of which are illustrated in FIG. 1. Where a plurality of channels are used, such as the three illustrated in FIG. 3, it is necessary to have means synchronized with the operation of the system for the purpose of synchronously connecting the different inputs in sequence to the input of the digitizing portion so that time sharing of the latter takes place. Under the conditions of no output signal from the transducer 1*a*, when the counter completes its first count the last stage 6*j* is utilized to provide a suitable reset pulse 44 on connection 46 which is differentiated and amplified in the unit 47 and appears as a negative-going pulse 48 at the output of the amplifier 47 on connection 49. Through a suitable isolating diode 51 the pulse 48 on connection 49 is supplied to the connection 52 constituting the input to the channel selecting matrix 3 and at the same time isolates the amplifier 47 from pulses 41 appearing on connection 27. It should be pointed here that the pulse 48 could be obtained from the output of the ladder ramp generator 4 which appears on connection 23. However, in order to prevent the degradation of the output signal of the ramp generator 4, the current output of the last stage 6*j* of the counter is used to energize the differentiating amplifier 47 so that the pulse 48 will have a larger amplitude and will not represent any loss to the variable reference voltage delivered by the ramp function generator 4.

Continuing with the operation of the device, we will now assume the second condition that is, when there is an output from the transducer 1*a* on the connection 28, that is, when $E_x$ is greater than zero. Just as an illustration, let us assume that the voltage $E_x$ on connection 28 is of such value that the counter 6 counts six steps until the generated ramp function voltage, plus the analog voltage equals or exceeds the firing voltage $E_F$ of the tunnel diode. This causes the tunnel diode to fire and the inhibitor gate 11 to close, stopping the clock pulses from the clock generator 9. The delayed reset pulse 41 on connection 27 and 42 will then reset the counter 6 and the counter will then begin to count from zero amplitude and zero time reference point back up to the instantaneous amplitude of the transducer output appearing on connection 28. It will be apparent that under this condition when the count does not run to the end of the counter 6 there would be no pulse 44 appearing on connection 46 and it is for this reason that the pulse 41 on connection 27 is supplied through the isolating diode 53 and through the input connection 52 to the matrix 3. From the circuit diagram, it will be apparent that the signals applied over connection 27 through the diode 53 will be isolated from the output of the differentiating amplifier 47 by means of the diode 51 while on the other hand the diode 53 will isolate connection 27 from pulses 48 appearing on the connection 49.

The matrix 3, for time sharing the digitizer 2 between the various transducers such as 1*a*, 1*b* and 1*j* is operated by a ring counter 56 having a counter stage corresponding to each transducer. For simplicity, only a three channel system is illustrated with the three transducers and accordingly the counter 56 has only three counter stages but it will be readily understood that any number of stages could be provided consistent with the results desired and the practicality of the complexity of the system. The counter 56, for all intents and purposes, is substantially identical with the counter 6 except, of course, since it operates entirely under all circumstances as a binary counter it is not necessary that any provision be made for resetting the stages. In accordance with conventional practice, both the parent and complement output of the stages of the counter 56 are coupled to the appropriate AND gates 16a, 16b and 17j through suitable diodes 3a.

Under all operating conditions, ring counter 56 operates in the same manner with any pulses being supplied on the connection 52 being stepped through the counter from left to right. In accordance with the discussion above, under conditions where the input $E_x=0$ for a particular channel, the last step of the counter 6 provides the necessary pulse 44 through the diode 51 to shift the ring counter 56 so that the next transducer will be connected to the junction point 18 which constitutes the common input to the digitizer 2. Under any conditions where the output of one of the transducers is greater than zero so that the counter 6 does not count through all of its stages the delayed reset pulse 41 on connection 27 will be supplied through the diode 53 to the connection 52 so that the next transducer output will be monitored and digitized by the digitizer 2. Of course, this cycle is repeated as soon as the pulses have been stepped through all of the stages of the counter 56 after which the cycle is repeated in a manner well understood in the art.

Summarizing, for conditions where the analog input signal $E_x=0$ the generated ramp function reference voltage is a series of periodic ramps, as indicated at FIG. 1 (a). For conditions where $E_x>0$ the ramp function reference voltage is aperiodic since the length of the count is inversely proportional to the amplitude of the input signal.

The output of the complement sides of the counter 6, can be utilized to provide the digital output, as previously explained. The analog voltage generated in the complement ramp generator 12 from the complement sides of the stages of counter 6, subjected to appropriate conversion can provide a time analog corresponding to the instantaneous input analog signal $E_x$.

The system described herein is adaptable to a multichannel telemetric system wherein a plurality of time functions may be sequentially sampled, the instantaneous values being digitized to provide signal which can be used for modulation purposes, or which can be indicated in digital form, or converted to voltage analog or time analog form.

While the invention has been shown in but one form, it will be obvious to those skilled in the art that it is not so limited, but is susceptible of various other changes and modifications without departing from the spirit thereof.

We claim as our invention:

1. An analog-to-digital converter comprising an electronic digital counter operable to count in binary digital representation of an analog in one direction from a selected lower value over a range of values at least as great as the variation of the analog input, electrical summation network means electrically coupled to said counter to generate a ramp function reference voltage, means responsive to an error signal represented by the algebraic sum of the analog input and the output of said summation network means for recycling said counter.

2. An analog-to-digital converter comprising an electronic digital counter operable to count in binary digital representation of an analog in one direction from a selected lower value to a value at least as great as the maximum value of the analog input, electrical summation network means electrically coupled to said counter to generate a ramp function reference voltage, means having a sharp break-over point responsive to the algebraic sum of the analog input and the output of said summation network means for recycling said counter.

3. An analog-to-digital converter comprising an electronic digital counter operable to count in binary digital representation of an analog in one direction from a lower value to a value at least as great as the maximum value of the analog input, negative resistance means having a sharp break-over point responsive to the algebraic sum of the analog input and the output of said summation network means for recycling said counter.

4. An analog-to-digital converter comprising an electronic digital counter operable to count in binary digital representation of an analog in one direction from a selected lower value to a value at least as great as the maximum value of the analog input, electrical summation network means electrically coupled to said counter to generate a ramp function reference voltage, negative resistance means responsive to an error signal represented by the algebraic sum of the analog input and the output of said summation network means for recycling said counter.

5. An analog-to-digital converter comprising an electronic digital counter operable to count in binary digital representation of an analog in one direction from a lower selected value to a value at least as great as the maximum value of the analog input, and means for recycling said counter when the output of said counter in the binary digital representation of the analog substantially equals the analog input.

6. An analog-to-digital converter comprising an electronic digital counter operable to count in binary digital representation of an analog in one direction from a selected lower value to a value at least as great as the maximum value of the analog input, electrical summation network means electrically coupled to said counter to generate a ramp function reference voltage, and means for recycling said counter when the output of said summation network means substantially equals the analog input.

7. An analog-to-digital converter comprising an electronic digital counter operable to count in binary digital representation of an analog in one direction to a value at least as great as the maximum value of the analog input, electrical summation network means electrically coupled to said counter to generate a ramp function reference voltage, means insensitive to the maximum value of the generated reference voltage but responsive to the algebraic sum of the output of said summation network means and the analog input for aperiodically stopping the operation of said counter.

8. An analog-to-digital converter comprising an electronic digital counter operable to count in binary digital representation of an analog in one direction from a selected lower value to a value at least as great as the maximum value of the analog input, electrical summation network means electrically coupled to said counter to generate a ramp function reference voltage, means responsive to an error signal represented by the algebraic sum of the analog input and the output of said summation network means for stopping said counter and means for indicating the instantaneous digital representation in said counter.

9. An analog-to-digital converter comprising an electronic digital counter operable to count in binary digital representation of an analog in one direction from a selected lower value to a value at least as great as the maximum value of the analog input, electrical summation network means electrically coupled to said counter to generate a ramp function reference voltage, means responsive to an error signal represented by the algebraic sum of the analog input and the output of said summation network means for stopping said counter means for indicating the instantaneous digital representation of said counter, and signal delay means responsive to said latter means for supplying a delayed signal for starting said counter.

10. An analog-to-digital converter comprising an electronic digital counter operable to count in binary digital representation of an analog in one direction from a selected lower value to a value at least as great as the maximum value of the analog input, electrical summation network means electrically coupled to said counter to generate a ramp function reference voltage, means having a zero or set state and having a sharp break-over point responsive to the algebraic sum of the analog input and output of said summation network means for stopping said counter, signal delay means responsive to said latter means for supplying a delayed signal for returning said latter means to its reset or zero position and means responsive to the algebraic difference within said reset position and the analog input for starting the operation of said counter.

11. An analog-to-digital converter comprising an electronic digital counter operable to count in binary digital representation of an analog in one direction from a selected lower value to a value at least as great as the maximum value of the analog input, electrical summation network means electrically coupled to said counter to generate a ramp function reference voltage, a bistable device having a negative characteristic between its two stable states responsive when in one stable state to the algebraic sum of the input analog and said summation network means for supplying a signal for stopping said counter means for delaying said signal and means responsive to said delayed pulse for returning said device to its stable state to develop an error signal between said analog input and the output of said summation network means to thereby restart said counter.

12. An analog-to-digital converter comprising an electronic digital counter operable to count in binary digital representation of an analog in one direction from a selected lower value to a value at least as great as the maximum value of the analog input, electrical summation network means electrically coupled to said counter to generate a ramp function reference voltage, a source of clock pulses, an inhibit gate between said clock and said counter, means responsive to the algebraic sum of said input analog and the output of said summation network means greater than the maximum value of said generated reference voltage for closing said inhibit gate and stopping the operation of said counter, signal delay means for delaying the signal responsive to said algebraic sum for resetting said means to zero whereby the algebraic difference between the output of said signal responsive means and the output of said summation network means provides a signal to open said inhibit gate and restart the counter.

13. An analog-to-digital converter comprising an electronic digital counter operable to count in binary digital representation of an analog in one direction from a selected lower value to a value at least as great as the maximum value of the analog input, electrical summation network means electrically coupled to said counter to generate a ramp function reference voltage, a bistable electronic switch means having in its first stable state a high positive resistance and having in its second stable state a negative differential resistance characteristic, said device being responsive to the algebraic sum of the analog input and the output of said summation network means greater than the maximum of said reference voltage to break-over into said second stable state for generating a signal for stopping said counter, said device in its second stable state providing a signal to hold said counter inoperative, signal delay means connected to the output of said electronic switch means and means responsive to the delayed signal for returning said device to its first stable state to resume the operation of said counter in response to an error signal representing the represented by the algebraic sum of the difference between the input analog and the generated reference voltage in said network means.

14. An analog-to-digital converter comprising an electronic digital counter operable to count in binary digital representation of an analog in one direction from a selected lower value to the value at least as great as the maximum value of the analog input, electrical summation network means electrically coupled to said counter to generate a ramp function reference voltage, means having two stable states responsive to an error signal represented by the algebraic sum of the analog input and the output of said summation network means for stopping said counter, signal delay means connected to said two state means, means responsive to delayed signal for resetting said two state means to its first state thus restarting said counter.

15. An analog-to-digital converter comprising an electronic digital counter operable to count in binary digital representation of an analog in one direction from a selected lower value to a value at least as great as the maximum value of an analog input bistable switch means having a first stable state with a positive resistance characteristic a sharp break-over point and a second stable state with a differential negative resistance characteristic electrical summation network means electrically coupled to said counter to generate a ramp function reference voltage a source of clock pulses, an inhibitor gate connected between said source of clock pulses and said counter means between said bistable device and said inhibitor gate for selectively closing said inhibitor gate to stop said counter when said bistable device is switched to its second stable state, signal delay means connected to said bistable device, means responsive to the delayed signal to switch said bistable device to its first stable state, all of the stages of said counter also being responsive to the delayed signal for resetting the stages to zero state whereby said counter starts counting again until the output of said summation network means substantially equal an input analog.

16. A multichannel communicator system, each channel having a transducer and a negative resistance device, a digitizer comprising an electronic digital counter operable to count in binary digital representation of an analog in one direction from a selected lower value to a value at least as great as the maximum value of analog input to said converter, electrical summation network means electrically coupled to said counter to generate a ramp function reference voltage, a source of clock pulses, an inhibitor gate between said source of clock pulses and said counter means responsive to an error signal represented by the algebraic sum of the analog input and the output of said summation network means for deriving a signal, signal delay means connected to said latter means, means for supplying said delayed signal to said counter to reset the latter to zero state, means responsive to said delayed signal for returning said error signal means to its first stable state to initiate the operation of said counter, and further means responsive to said delayed signal for selectively connecting said plurality of channels in sequence to said digitizer.

References Cited by the Examiner

UNITED STATES PATENTS 3,062,970 11/1962 Kam Li ------------ 340—347

OTHER REFERENCES

IBM Tech. Discl. Bulletin, vol. 5, No. 8, January 1963, p. 51.

MAYNARD R. WILBUR, *Primary Examiner.*

DARYL W. COOK, *Examiner.*

K. R. STEVENS, W. J. KOPACZ, *Assistant Examiners.*